United States Patent
Tsai

(10) Patent No.: US 6,300,250 B1
(45) Date of Patent: Oct. 9, 2001

(54) METHOD OF FORMING BUMPS FOR FLIP CHIP APPLICATIONS

(75) Inventor: Ming-Hsing Tsai, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/369,260

(22) Filed: Aug. 9, 1999

(51) Int. Cl.[7] ............................................. H01L 21/311
(52) U.S. Cl. ............................ 438/694; 438/720; 438/959
(58) Field of Search .................................. 438/613, 614, 438/959, 641, 694, 674, 675, 700, 720

(56) References Cited

U.S. PATENT DOCUMENTS

| 4,182,781 | 1/1980 | Hooper et al. ........................ 427/90 |
| 5,300,461 | * 4/1994 | Ting ...................................... 437/227 |
| 5,480,835 | 1/1996 | Carney et al. ........................ 437/189 |
| 5,541,135 | 7/1996 | Pfeifer et al. ........................ 437/60 |
| 5,646,067 | * 7/1997 | Gaul .................................... 437/180 |
| 5,742,094 | * 4/1998 | Ting ..................................... 257/620 |
| 5,863,812 | 1/1999 | Manteghi ............................. 438/108 |
| 5,891,804 | 4/1999 | Havemann et al. ................. 438/674 |
| 5,903,058 | * 5/1999 | Akram ................................. 257/778 |

* cited by examiner

Primary Examiner—Robert Kunemund
Assistant Examiner—Kin-Chan Chen
(74) Attorney, Agent, or Firm—George O. Saile; Stephen B. Ackerman

(57) ABSTRACT

A new method is provided to create metal bumps on a surface, metal contact pads have been provided in this surface. A layer of dielectric is deposited over a surface; an opening is created in the layer of dielectric that aligns with the contact pad. A barrier layer is deposited over the layer of dielectric including the inside of the opening; a seed layer is deposited over the barrier layer. The seed layer is selectively removed from above the layer of dielectric leaving the seed layer intact and deposited over the inside surfaces of the opening, the barrier layer is left intact over the layer of dielectric and inside the opening. Using Electrical Chemical Deposition (ECD) technology, the metal bump is now selectively grown thereby eliminating previously experienced disadvantages when creating metal bumps of decreased pitch and mask alignments and resolution.

20 Claims, 2 Drawing Sheets

METHOD OF FORMING BUMPS FOR FLIP CHIP APPLICATIONS

BACKGROUND OF THE INVENTION (1) Field of the Invention

The invention relates to the fabrication of integrated circuit devices, and more particularly, to a method of forming solder bumps for flip-chip applications.

(2) Description of the Prior Art

A continued decrease in semiconductor device feature size, a decrease that is driven by the dual requirements of improved device performance and reduced device manufacturing cost, has over the years resulted in placing increased emphasis on device packaging. This trend has further, due to a significant increase in semiconductor device density, placed increased emphasis on device or package I/O capabilities. The metal connections, which connect the Integrated Circuit to other circuit or system components, have therefore become of relative more importance and potentially have, with the further miniaturization of the IC, an increasingly negative impact on the circuit performance. If the parasitic capacitance and resistance of the metal interconnections increases, the chip performance can be degraded significantly. Of most concern in this respect is the voltage drop along the power and ground buses and the RC delay of the critical signal paths. Attempts to reduce the resistance by using wider metal lines result in higher capacitance of these wires.

One of the approaches that has been taken to solve these packaging problems is to develop low resistance metal (such as copper) for the wires while low dielectric materials are used in between signal lines. Another approach to solve problems of I/O capability has been to design chips and chip packaging methods that offer dependable methods of increased interconnecting of chips at a reasonable manufacturing cost. This has led to the development of Flip Chip Packages.

Flip-chip technology fabricates bumps (typically Pb/Sn solders) on Al pads on the chips and interconnects the bumps directly to the package media, which are usually ceramic or plastic based. The flip-chip is bonded face down to the package medium through the shortest paths. These technologies can be applied not only to single-chip packaging, but also to higher or integrated levels of packaging in which the packages are larger and to more sophisticated substrates that accommodate several chips to form larger functional units.

The flip-chip technique, using an area I/O array, has the advantage of achieving the highest density of interconnection to the device combined with a very low inductance interconnection to the package. However, pre-testability, post-bonding visual inspection, and Coefficient of Thermal Expansion (CTE) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

The packaging substrate is generally used for Ball Grid Array (BGA) packages but can also be used for Land Grid Array (LGA) and Pin Grid Array (PGA) packages.

Prior Art substrate packaging uses ceramic and plastic flip chip packaging. Ceramic substrate packaging is expensive and has proven to limit the performance of the overall package. Recent years has seen the emergence of plastic substrate flip chip packaging, this type of packaging has become the main stream design and is frequently used in high volume flip chip package fabrication. The plastic substrate flip chip package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 um.), the plastic flip chip structure becomes complicated and expensive. This can be traced to the multi-layer structure used to create the plastic flip chip package. This multi-layer structure results in a line density within the package of typically 2–3 mil or 50 u–75 u range. This line density is not sufficiently high for realizing the fan out from the chip I/O to the solder balls on the package within a single layer, leading to the multi-layer approach. The multi-layer approach brings with it the use of relatively thick (50 u–75 u) dielectric layers, these layers have a Coefficient of Thermal Expansion (CTE) that is considerably higher than the CTE of the laminate board on which the plastic flip chip package is mounted. To counteract this difference in CTE's the overall package must be (thermally and mechanically) balanced resulting in the use of additional material and processing steps to apply these materials, increasing the cost of the BGA package and creating a yield detractor.

Other Prior Art applications use thin film interconnect layers for chip or wire bond packaging substrates. These applications start with a laminate substrate onto which the thin film layers are deposited. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not require the counter-balancing of thick layers of dielectric in order to establish dimensional stability. A disadvantage of the laminate substrate is that the process of mechanically drilling holes through the laminate substrate is time-consuming, adding cost to the process. Further, the planarity of the laminate substrate does not meet planarity requirements for the deposition of thin films. Good planarity for the surface of the laminate substrate is established by depositing dielectrics and metal layers on the initial surface of the laminate structure, steps that again add to the processing cost of the flip chip structure. Since the laminate substrate is composed using organic materials, the substrate is also not dimensionally stable resulting in warpage and dimensional variations during high temperature processing and wet chemical interactions. This results in additional processing complications and costs.

The packaging of a flip chip to a printed circuit board consists of attaching the flip chip to this board or to any other matching substrate. A flip chip is a semiconductor chip that has a pattern or array of terminals spaced around the active surface of the flip chip, the flip chip is mounted face (active surface) down onto a substrate. Electrical connectors that are provided on the active surface of the flip chip can consist of Ball Grid Arrays (BGA's) and Pin Grid Arrays (PGA's). With the BGA, an array of minute solder balls is disposed on the surface of the flip chip for attachment to the surface of the substrate. For PGA's, an array of small pins extends essentially perpendicularly from the active surface of the flip chip, such that the pins conform to a specific arrangement on a printed circuit board or other substrate for attachment. An extension of the BGA concept is the Slightly Larger than Integrated Circuit Carrier (SLICC) arrangement which is characterized by a smaller solder ball pitch and a smaller solder ball diameter than the BGA. It is clear that the solder or other conductive ball or pin arrangements of the flip chip must be a mirror image of the connecting bond pads on the printed circuit board so that precise connection can be made. The flip chip is bonded to the printed circuit board by refluxing the solder balls or pins (for the PGA) of the flip chip. The solder balls may also be replaced with a conductive polymer.

Flip chips are typically hermetically sealed to the substrate by using glob top and underfill materials between the flip chip and the substrate. Not all flip chip packages use chip back surface protection (glob top) leaving the chip exposed to environmental damage. The underfill encapsulant generally enhances the attachment of the semiconductor die to the substrate while providing environmental protection to the chip. The application of the underfill in particular must be carefully monitored in order to avoid problems of void creation, contaminant penetration and overfill that may cover the edges of the chip or that can spread to adjacent areas of the board that do not require fill. A variety of polymers can be used as underfill encapsulants, including thermosetting molding compounds such as silicones, epoxies, polyamides and parylenes. A glob of encapsulant material is generally applied to the COB assembly to surround the semiconductor chip and the substrate. Organic materials that are used in the glob top encapsulation are generally selected for their low moisture permeability and low thermal coefficient of expansion to avoid moisture or mechanical stress. It is critical that all encapsulation methods and materials are aimed at maximizing the heat transfer between the chip and the substrate and other environmental media thereby improving heat dissipation characteristics of the overall package.

Conventional methods that are used to create metal bumps on the surface of a wafer are highlighted in FIGS. 1a through 1e. During this process it is important to carefully consider the eutectic characteristics of the materials that are use. Eutectic is defined as a material formed of an alloy or solution having its components in such proportions that the melting point is the lowest possible with such components. The eutectic properties of a material also refer to the characteristic microstructure that results when the material solidifies. In short: the materials that are used for these processes must be such that reflow of the solder balls is possible without significantly affecting the quality of the electrical interconnect that is established by the reflow.

FIG. 1a shows an electrical pad or point of interconnect 12 that has been created in a semiconductor surface 10, typically the surface of a substrate. A layer 14 of dielectric material is deposited over the surface of the substrate thereby including the surface of the pad 12. An opening 18 is created in layer 14; this opening aligns with the pad 12. A layer 16 of metal, typically referred to as the Under Bump Metal (UBM) and also referred to as the barrier layer, is blanket deposited over the layer 14 thereby including the inside walls and bottom of the opening 18.

FIG. 1b shows how the contact opening is prepared for the deposition of the bump metal. A layer 20 of photoresist is deposited and patterned, this pattern aligns with opening 18.

FIG. 1c shows the deposition of the metal for the bump on the surface of the substrate. This metal 22 can for instance be copper or nickel. The deposition is an electrochemical deposition whereby the layer 16 of UBM is connected to one of the electroplates.

FIG. 1d shows the cross section after the removal of the layer of photoresist (layer 20, FIG. 1c).

FIG. 1e shows how the bump is made to further protrude from the surface of the wafer by performing an etch whereby the layer 16 of UBM and the dielectric/passivation layer 14 surrounding plug 22 are removed.

Another Prior Art method of forming metal bumps (not shown) is a process whereby a metal contact pad is created in a semiconductor surface, a layer of dielectric material is deposited and patterned whereby-the openings created in this layer align with the metal pad. A barrier layer is deposited inside the created opening, a layer of photoresist is deposited and patterned over the layer of dielectric whereby the openings created in the layer of photoresist again align with the metal pad. The process that has been described up to this point results in a cross section that is identical to the cross section shown in FIG. 1c. The metal plug is now formed by methods of rf sputtering after which the various layers can be removed from the region surrounding the created metal plug leaving the metal plug protruding from the surface and aligned with the metal pad. The disadvantage of this method is the layer of photoresist that must be applied as part of the procedure must be 20 $\mu$m thick due to limitations imposed by the rf sputtering process (providing adequate protection against penetration of the sputtered metal). It is well know in the art that it is difficult to form photoresist accurately when applied very thick. Multiple steps can be used to increase the thickness of the layer of photoresist; this however increases the cost of the process. This limits the design freedom that is required in designing metal plugs because a photoresist coating of this thickness does not allow the creation of solder bumps with a small distance (pitch) between adjacent bumps.

Yet another Prior Art method (not shown) depends on methods of etching to create the profile of the metal plug. This method suffers from the disadvantage that copper, used for the metal plug, is difficult to etch while again a layer of photoresist must be-used that is 20 $\mu$m thick, leading to the same design limitations as already highlighted.

Yet another Prior Art method applies Physical Vapor Deposition (PVD) through a metal mask. This method is very slow since the deposition rate using this technique is about 500 Angstrom per minute. This as opposed to a metal deposition rate when using Electrical Chemical Deposition (ECD) technology of 3500 Angstrom per minute. In view of the fact that a typically metal bump is required to have an extension or thickness of about 5 to 20 $\mu$m, it can be appreciated that the approach of using either PVD or ECD technology is unacceptably slow in the deposition of the plug metal. In addition, the indicated method suffers from poor mask alignments and from poor pattern definition and resolution.

The invention addresses the above-indicated problems that are encountered during conventional creation of metal bumps. The invention does not use the method of electro-chemical deposition FIGS. 1a through 1e or the method of rf sputtering or the method of etching or the method of PVD/ECD that have previously been highlighted under the Prior Art approaches in creating metal bumps.

SUMMARY OF THE INVENTION

A principle objective of the invention is to provide a simple and effective method of creating metal bumps on a surface.

Another objective of the invention is to resolve problems of photoresist resolution that are typically encountered in the process of creating metal bumps on a surface.

Yet another objective of the invention is to improve flip chip yield loss that is encountered during the process of forming metal bumps on a surface.

A still further objective of the invention is to improve electrical and reliability performance of metal bumps that are created on a surface.

In accordance with the objectives of the invention a new method is provided to create metal bumps on a surface, metal contact pads have been provided in this surface. A layer of dielectric is deposited over a surface; an opening is created in the layer of dielectric that aligns with the contact pad. A barrier layer is deposited over the layer of dielectric including the inside of the opening; a seed layer is deposited over the barrier layer. The seed layer is selectively removed from above the layer of dielectric leaving the seed layer intact and deposited over the inside surfaces of the opening, the barrier layer is left intact over the layer of dielectric and inside the opening. Using Electrical Chemical Deposition (ECD) technology, the metal bump is now selectively grown thereby eliminating previously experienced disadvantages when creating metal bumps of decreased pitch and mask alignments and resolution.

BRIEF DESCRIPTION OF THE DRAWINGS

FIG. 1a shows a cross section of a surface after the creation of a metal pad in the surface, the deposition and patterning of a layer of dielectric and the deposition of a layer of barrier material.

FIG. 1b shows a cross section of a surface after the deposition and patterning of a layer of photoresist.

FIG. 1c shows a cross section of a surface after the electrochemical creation of a metal plug.

FIG. 1d shows a cross section of a surface after the removal of the layer of photoresist.

FIG. 1e shows a cross section of a surface after the removal of the barrier and the dielectric layers.

FIG. 2 shows a cross-section of a surface in which a metal pad has been created.

FIG. 3 shows a cross section of a surface in which a metal pad has been created and over the surface of which has been deposited a layer of dielectric.

FIG. 4 shows a cross section of a surface after the patterning and etching of the layer of dielectric.

FIG. 5 shows a cross section of a surface after the deposition of a barrier layer.

FIG. 6 shows a cross section of a surface after the deposition of a seed layer.

FIG. 7 shows a cross section of a surface after the selective removal of the seed layer from above the layer of dielectric.

FIG. 8 shows a cross section of a surface after the selective growth of a metal bump.

DESCRIPTION OF THE PREFERRED EMBODIMENTS

Conventional methods of creating solder bumps for flip chip applications use the evaporation of the material (that is used for the bump) through a metal mask in combination with the metal lift-off process. The metal mask that is used for this process can be used only a limited number of times due to the heavy deposition of materials on the surface of the mask, resulting in having to change the mask after only three applications. The lift-off process typically uses a heavy (40 $\mu$m) coating of photoresist which means that the spacing (pitch) between adjacent solder bumps must be relatively large, a process therefore that does not lend itself to increased miniaturization of device feature sizes. The conventional approach has therefore, in the era of decreasing device feature sizes and the therefrom following decrease in the required solder ball pitch, resulted in increased chip yield losses.

Figure 1A:
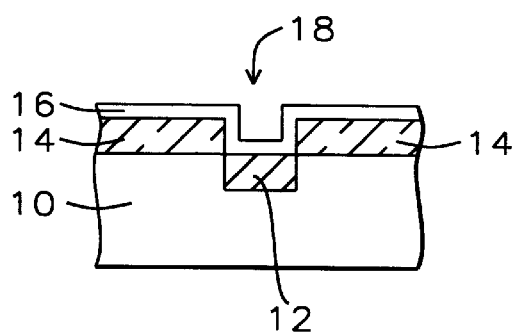
FIGS. 1a through 1e show a Prior Art process of creating metal bumps, as follows.
Figure 1B:
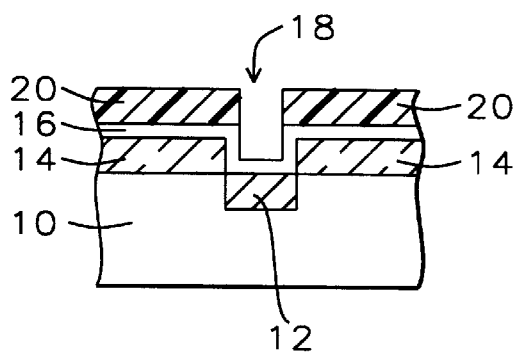
Figure 1C:
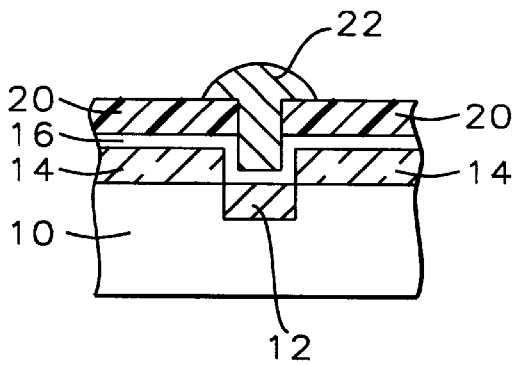
Figure 1D:
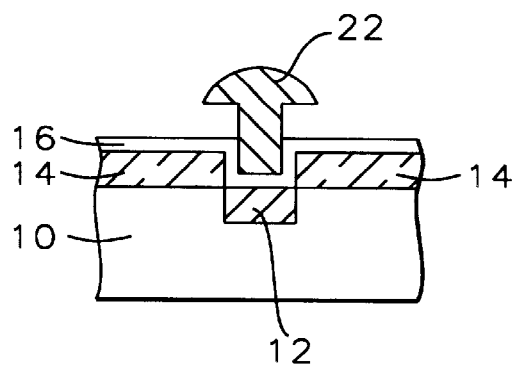
Figure 1E:
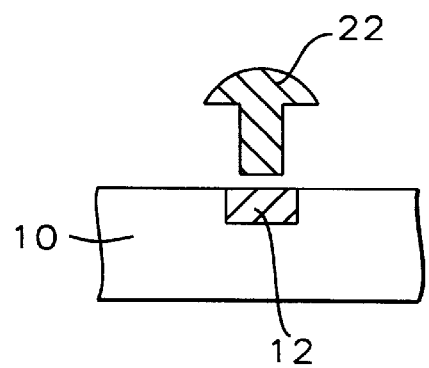
Figure 2:
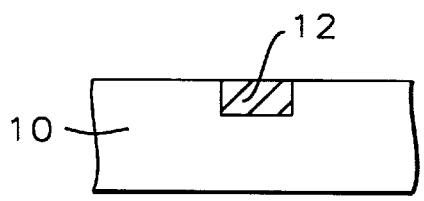
FIGS. 2 through 8 address the process of the invention to create a metal plug, as follows.

Referring now specifically to FIG. 2 there is shown a cross section of a semiconductor surface 10 in which a metal contact pad 12 has been created. The semiconductor surface 10 is typically the surface of a monocrystalline (100) silicon substrate. Contact pad 12 can be any point of electrical contact in the surface and can, as such, by a contact pad, a point of contact in a network of interconnect lines and others. Contact pad 12 can be created using conventional state of the art processing procedures.

Figure 3:
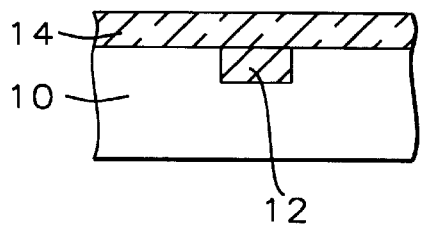

FIG. 3 shows a cross section of surface 10 after a layer 14 of dielectric has been deposited over this surface thereby including the surface of metal contact pad 12.

Suitable dielectric materials that can be used for layer 14 are, for instance, silicon dioxide ("oxide", doped or undoped) or silicon nitride ("nitride"), silicon oxynitride, fluoropolymer, parylene, poyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), tantalum pentoxide (Ta205), plasma enhanced silicon nitride (PSiNx), titanium oxide, oxynitride, a low dielectric constant material, such as hydrogen silsesquioxane, HDP-FSG (high-density-plasma fluorine-doped silicide glass).

The most commonly used dielectrics are silicon dioxide (doped or undoped), silicon oxynitride, parylene or polyimide, spin-on-glass, plasma oxide or LPCVD oxide.

The layer 14 of dielectric can be deposited using either LPCVD, PECVD, or APCVD processing, at a temperature between about 400 to 800 degrees C. to a thickness between about 5000 to 10000 Angstrom.

Figure 4:
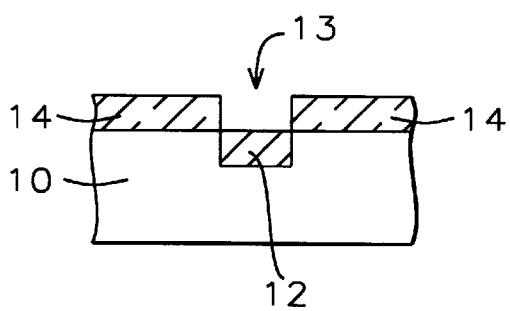

FIG. 4 shows a cross section of a surface after the deposited layer 14 of dielectric has been patterned and etched to form an opening 13 that aligns with the metal pad 12. The patterning of layer 14 is done by standard processing of depositing a photoresist layer, masking and exposing the photoresist layer with a photolithographic procedure and removing the exposed photoresist thereby creating the opening 13. The etching of layer 14 is an anisotropic etch using RIE processing with said opening having an opening between about 0.3 to 200 $\mu$m. in diameter, resulting in an aspect ratio of between about 1 to 3. Etchants that can be used for this etch of layer 14 are $CHF_3/O_2/Ar/N_2$ or $CH_2F_2/O_2/Ar/N_2$ or $CH_3F/O_2/Ar/N_2$ or $C_4H_8/O_2/Ar/N_2$.

Figure 5:
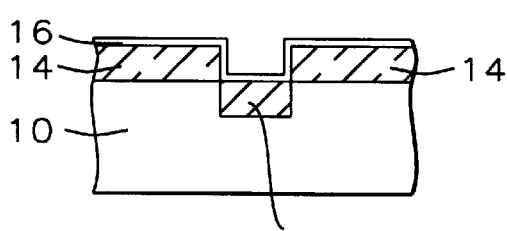

FIG. 5 shows a cross section of the surface after a barrier layer 16 has been deposited over the surface of the dielectric layer 14 and inside the opening 13 thereby covering the sidewalls and the bottom surface of opening 13.

Barrier layers are typically used to prevent diffusion of the interconnect metal into surrounding layers of dielectric and silicon. Some of the considerations that apply in selecting a material for the barrier layer become apparent by using copper for interconnect metal as an example. Although copper has a relatively low cost and low resistivity, it has a relatively large diffusion coefficient into silicon dioxide and silicon and is therefore not typically used as an interconnect metal. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes a desired increase in capacitance between the interconnect and the substrate.

A typical diffusion barrier layer may contain silicon nitride, phosphosilicate glass (PSG), silicon oxynitride, aluminum, aluminum oxide ($Al_xO_y$), tantalum, Ti/TiN or Ti/W, nionbium, or molybdenum and is more preferably formed from TiN. The barrier layer can also be used to improve the adhesion of the subsequent overlying tungsten layer.

A barrier layer is preferably about 100 and 500 angstrom thick and more preferably about 300 angstrom thick and can be deposited using rf sputtering.

Figure 6:
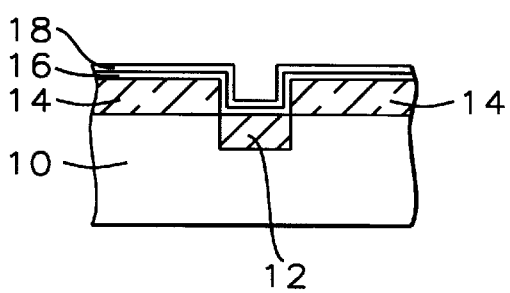

FIG. 6 shows a cross section of the surface after the deposition of a seed layer 18 over the surface of barrier layer 16. The seed layer 18 may contain a pure metal and may also contain a doped metal, dependent on the fill that is used to create the metal plug. The purpose of the seed layer is to enhance adhesion of the metal plug to the surfaces of the opening in which the metal plug is created. The metal that is therefore typically used for the seed layer is the same metal that is used to create the metal plug. Doping that may be added to the layer is at times provided based on considerations of surface oxidation or other surface damage that may be incurred by the seed layer during exposure to either atmospheric or processing environments. Seed layers are typically deposited to a thickness of between about 200 and 400 Angstroms and can be deposited using rf sputtering techniques.

Figure 7:
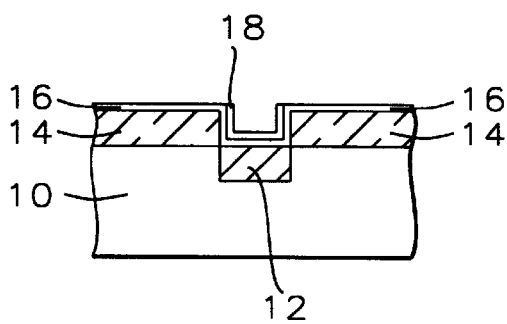

FIG. 7 shows a cross section of the surface after applying the process of CMP to the surface of the seed layer thereby removing the layer seed layer down to the surface of the barrier layer 16. A slight overetch into the surface of the barrier layer is allowed but the barrier layer should remain in place to a significant thickness in order to also protect the surface of the dielectric layer 14 during subsequent processing steps.

Figure 8:
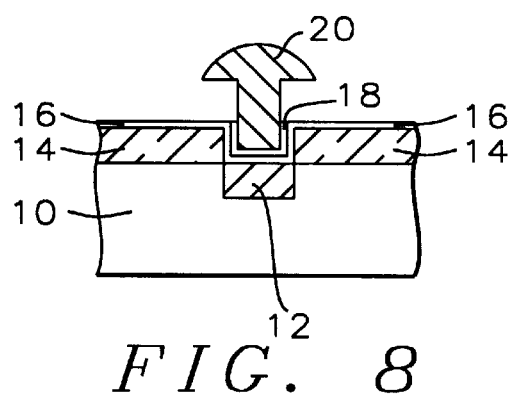

FIG. 8 shows a cross section of the surface after the metal plug 20 has been created by selective ECD growth.

The ECD bath processing parameters are as follows: temperature between about 25 and 50 degrees, the source of deposition of the $H_2SO_4$ is the dilution of $H_2SO_4$, $CuSO_4$ and HCl with a deposition flow rate of between about 15 K and 20 K sccm and a deposition time of between about 1 and 10 minutes, the voltage applied to the anode between about 0.1 and 2 volts and the voltage applied to the cathode between about 0.1 and 2 volts.

The ECD process creates the metal plug in a well controlled manner due to the fact that ECD Cu deposits Cu only on places that have a Cu seed, without the Cu seed the ECD bath does not deposit Cu.

The process of the invention offers the following advantages as is clear from the above discussion:

metal plug pitch can be decreased since the process of the invention does not use a layer of photoresist for the formation of the metal plug the process of forming the metal plug is self aligned with the opening that has been created in the layer of dielectric due to the nature of the ECD process the method of the invention does not suffer from the contamination that typically accompanies a process that uses photoresist the process of the invention is reliable and as such offers a high yield in the creation of the metal plugs.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming metal bumps on semiconductor surface, comprising the steps of:

providing a substrate, said substrate having been provided with metal points of electrical contact over the surface thereof, said metal points of electrical contact being interconnected to integrated circuitry provided in or on the surface of said substrate;

depositing a dielectric layer over the surface of said substrate;

patterning and etching said dielectric layer, creating at least one opening in said dielectric layer by applying an anisotropic etch using RIE processing, said at least one opening in said layer of dielectric having vertical sidewalls;

depositing a barrier layer over the surface of said dielectric layer, including inside surfaces of said at least one opening, thereby maintaining said vertical sidewalls of said at least one opening created in said layer of dielectric;

depositing a seed layer over the surface of said barrier layer, thereby maintaining said vertical sidewalls of said at least one opening created in said layer of dielectric;

removing said seed layer from the surface of said barrier layer deposited over the surface of said dielectric, leaving said seed layer in place overlying said barrier layer deposited over said inside surfaces of said at least one opening created in said dielectric layer; and depositing said metal bumps over the surface of said seed layer left in place overlying said barrier layer by depositing a solder mass over at least one of said at least one opening in said layer of dielectric using Electrical Chemical Deposition (ECD) technology, providing levels of deposition of said metal bumps controllable to a molecular level, allowing for creation of metal bumps having an ultra-small diameter, providing metal bumps suitable for a sub-micron device environment.

2. The method of claim 1 wherein said depositing a dielectric layer over the surface of said substrate is depositing a layer of material that contains one or more elements selected from the group consisting of silicon dioxide (doped and undoped), silicon oxynitride, silicon nitride, parylene and polyimide, spin-on-glass, plasma oxide and LPCVD oxide.

3. The method of claim 1 wherein said depositing a dielectric layer over the surface of said substrate is using either LPCVD, PECVD, or APCVD processing, at a temperature between about 400 to 800 degrees C. whereby said layer of dielectric is deposited to a thickness between about 5000 to 10000 Angstrom.

4. The method of claim 1, said patterning and etching said dielectric layer creating at least one opening in said dielectric layer is:
- depositing a layer of photoresist over the surface of said layer of dielectric;
- exposing said layer of photoresist, using photolithography, in a pattern overlying and aligning with said points of electrical contact in the surface of said substrate;
- removing said photoresist from above said points of electrical contact in the surface of said substrate, creating a photoresist mask, exposing the surface of said layer of dielectric in a pattern overlying and being aligned with said points of electrical contact in the surface of said substrate;
- etching said dielectric layer in accordance with said photoresist mask, applying an anisotropic etch using RIE processing, creating at least one opening in said layer of dielectric having vertical sidewalls, said openings created in said layer of dielectric overlying and being aligned with at least one of said points of electrical contact in the surface of said substrate; and
- removing said photoresist mask from the surface of said layer of dielectric.

5. The method of claim 4, said removing said photoresist from above said points of electrical contact in the surface of said substrate being performed by etching, creating openings in said layer of photoresist having vertical sidewalls, enabling subsequent anisotropic etching of said layer of dielectric.

6. The method of claim 5, said etching being selected from the group consisting of sputter etching and wet etching.

7. The method of claim 5, said etching comprising sputter etching after application of said photoresist layer over said layer of dielectric, defining an intended location of said at least one opening in said layer of dielectric whereby at least one opening of said at least one opening aligns with said electrical points of contact provided on the surface of said substrate.

8. The method of claim 5, said etching comprising wet etching after application of a resist layer over said layer of dielectric thereby defining an intended location of said at least one opening in said layer of dielectric whereby at least one of said at least one opening aligns with said electrical points of contact provided on the surface of said substrate.

9. The method of claim 1, said depositing a barrier layer over the surface of said dielectric layer is depositing a material that is selected from the group consisting of silicon nitride, phosphosilicate glass (PSG), silicon oxynitride, aluminum, aluminum oxide ($Al_xO_y$), tantalum, Ti/TiN and Ti/W, nionbium and molybdenum and more preferably comprises TiN whereby said barrier layer is preferably about 100 and 500 Angstrom thick and more preferably about 300 Angstrom thick and is deposited using rf sputtering.

10. The method of claim 1, said depositing a seed layer over said barrier layer is depositing a metal or metal compound to a thickness of between about 200 and 400 Angstroms using rf sputtering techniques.

11. The method of claim 1, said removing said seed layer from the area surrounding said opening and above said substrate being a CMP process, said removal proceeding to at least down to the surface of said barrier layer whereby furthermore a slight over polish into the surface of said barrier layer can be applied.

12. The method of claim 1, said metal bumps comprising one of the elements selected from the group consisting of copper and gold and nickel and their compounds.

13. The method of claim 1 with additional steps of removing said layers of barrier material and of dielectric surrounding said created metal bumps on the surface of said substrate, allowing further protrusion of said metal bumps from said substrate surface, said steps being performed after said metal bumps have been created.

14. A method of forming metal bumps on a semiconductor surface, said metal bumps comprising one of the components selected from the group consisting of copper and gold and nickel and their compounds, comprising the steps of:
- providing a substrate, said substrate having been provided with metal points of electrical contact, said metal points of electrical contact being interconnected to integrated circuitry provided in or on the surface of said substrate;
- depositing a dielectric layer over the surface of said substrate, using either LPCVD, PECVD, or APCVD processing, at a temperature between about 400 to 800 degrees C., said layer of dielectric being deposited to a thickness between about 5000 to 10000 Angstrom;
- patterning and etching said dielectric layer by applying an anisotropic etch using RIE processing, creating at least one opening in said dielectric layer, said at least one opening in said layer of dielectric having vertical sidewalls, said at least one opening overlying and aligning with at least one of said metal points of electrical contact provided in the surface of said substrate;
- depositing a barrier layer over the surface of said dielectric layer, including inside surfaces of said opening, said deposition preferably being depositing a layer of TiN, said barrier layer preferably being about 100 and 500 Angstrom thick and more preferably about 300 Angstrom thick and being deposited using rf sputtering, thereby maintaining said vertical sidewalls of said at least one opening created in said layer of dielectric;
- depositing a seed layer over said barrier layer, said seed layer comprising a metal or metal compound, furthermore said seed layer being deposited to a thickness of between about 200 and 400 Angstroms using rf sputtering techniques, thereby maintaining said vertical sidewalls of said at least one opening created in said layer of dielectric;
- removing said seed layer from an area surrounding said at least one opening created in said layer of dielectric using a CMP process, said removal proceeding to at least down to the surface of said barrier layer; and
- creating said metal bumps by depositing a solder mass over at least one of said at least one opening in said layer of dielectric using selective ECD metal growth techniques, providing levels of deposition of said metal bumps controllable to the molecular level, allowing for creation of metal bumps having an ultra-small diameter, providing metal bumps suitable for a sub-micron device environment.

15. The method of claim 14, said dielectric being selected from the group consisting of silicon dioxide (doped and undoped), silicon oxynitride, silicon nitride, parylene and polyimide, spin-on-glass, plasma oxide and LPCVD oxide.

16. The method of claim 14, said metal bumps comprising one of the elements selected from the group consisting of copper and gold and nickel and their compounds.

17. The method of claim 14, said layer of dielectric being deposited using either LPCVD, PECVD, or APCVD processing, at a temperature between about 400 to 800 degrees C., said layer of dielectric being deposited to a thickness between about 5000 to 10000 Angstrom.

18. The method of claim 14, said barrier layer comprising TiN, said barrier layer preferably being about 100 and 500 Angstrom thick and more preferably about 300 Angstrom thick and being deposited using rf sputtering.

19. The method of claim 14, said seed layer comprising a metal or metal compound deposited to a thickness of between about 200 and 400 Angstroms using rf sputtering techniques.

20. The method of claim 14 with additional steps of removing said layers of barrier material and of dielectric surrounding created metal bumps on the surface of said substrate, allowing said metal bumps to further protrude from said substrate surface, said additional steps being performed after said metal bumps have been created.

* * * * *